United States Patent
Vincent et al.

(10) Patent No.: US 9,075,938 B2
(45) Date of Patent: Jul. 7, 2015

(54) METHOD AND APPARATUS FOR MAPPING OF MULTIPLE-FLOOR STRUCTURES

(75) Inventors: Regis Vincent, San Mateo, CA (US); Benson Limketkai, Seattle, WA (US); Michael A. Eriksen, Seattle, WA (US)

(73) Assignee: SRI International, Menlo Park, CA (US)

( * ) Notice: Subject to any disclaimer, the term of this patent is extended or adjusted under 35 U.S.C. 154(b) by 700 days.

(21) Appl. No.: 12/696,819

(22) Filed: Jan. 29, 2010

(65) Prior Publication Data

US 2010/0223031 A1 Sep. 2, 2010

Related U.S. Application Data (60) Provisional application No. 61/156,380, filed on Feb. 27, 2009.

(51) Int. Cl.
*G06F 17/50* (2006.01)
*G06F 19/00* (2011.01)

(52) U.S. Cl.
CPC .................................. *G06F 17/5004* (2013.01)

(58) Field of Classification Search
CPC .......... G06K 9/00664; G06K 9/00691; G06K 9/00805; G05D 1/0274; G06F 17/5004
USPC .......... 701/450, 451, 452, 453; 700/245, 248; 434/79
See application file for complete search history.

(56) References Cited

U.S. PATENT DOCUMENTS

| 7,649,534 B2 * | 1/2010 | Salmre .......................... 345/441 |
| 7,873,465 B2 * | 1/2011 | Geelen et al. ................. 701/450 |
| 8,060,254 B2 * | 11/2011 | Myeong et al. ............... 700/253 |
| 2007/0112461 A1 * | 5/2007 | Zini et al. ...................... 700/245 |

OTHER PUBLICATIONS

Leon et al., Multi-robot SLAM and map merging, 2008, Univeridade de Vigo.*
Jung et al., High resolution terrain mapping using low altitude aerial stereo imagery, 2003, IEEE.*
Meijers et al., 3D geo-information indoors: structuring for evacuation, 2005, Delft University of Technology.*
Burgard et al., Collaborative multi-robot exploration, 2000, IEEE.*
Blanco et al., An entropy-based measurement of certainty in Rao-Blackwellized particle filter mapping, 2006, IEEE.*
Wolf et al., Mobile robot simultaneous localization and mapping in dynamic environments, 2005, Springer.*

(Continued)

*Primary Examiner* — Thomas G Black
*Assistant Examiner* — Sara Nelson
(74) *Attorney, Agent, or Firm* — Barnes & Thornburg LLP (57) ABSTRACT

A method for mapping a multiple-floor structure includes building a plurality of maps that includes one map for each of at least two of the floors, detecting a set of anchor points, where the set of anchor points includes at least one anchor point on each of the maps, linking the anchor points to produce a set of linked anchor points, and aligning the maps around the set of linked anchor points to produce a set of aligned maps. A method for mapping a structure using a single robot includes generating, by the robot, a first map at a first point in time, storing the first map, generating, by the same robot, a second map at a second point in time subsequent to the first point in time, and aggregating the first map and the second map to produce an aggregated map.

17 Claims, 6 Drawing Sheets

(56) References Cited

OTHER PUBLICATIONS

Iocchi et al., Building multi-level planar maps integrating LRF, stereo vision and IMU sensors, 2007, IEEE.*
Iocchi et al., Building 3D maps with semantic elements integrating 2D laser stereo vision and IMU on a mobile robot, 2007, Sapienza University of Rome.*
Whiting et al., Topology of Urban Environments, 2007, MIT.*
Markan, BMG Notes as of Oct. 2002, 2002, MIT.*
Leon et al., Multi-robot SLAM and map merging, 2008, Universidade de Vigo.*
Biber, The Normal Distributions Transform: A new approach to laser scan matching, 2003, IEEE.*
Porta et al., Appearance-based Concurrent Map Building and Localization using a Multi-Hypotheses tracker, 2004, IEEE.*
Carpin et al., On map merging, Aug. 2005, Robotics and Autonomous Systems.*
Wolf et al., Mobile robot simultaneous localization and mapping in dynamic environments, 2005, Springer Science.*
Iocchi et al., "Building 3D maps with semantic elements integrating 2D laser stereo vision and IMU on a mobile robot," 2007, Sapienza University of Rome.*
Whiting et al., "Topology of Urban Environments," 2007, MIT.*
Markan, "MBG Notes as of Oct. 2002," 2002, MIT.*

* cited by examiner

METHOD AND APPARATUS FOR MAPPING OF MULTIPLE-FLOOR STRUCTURES

CROSS REFERENCE TO RELATED APPLICATIONS

This application claims the benefit of U.S. Provisional Patent Application No. 61/156,380, filed Feb. 27, 2009, which is herein incorporated by reference in its entirety.

FIELD OF THE INVENTION

The present invention relates generally to robotic navigation, and relates more particularly to simultaneous localization and mapping (SLAM).

BACKGROUND OF THE INVENTION

Mobile robotics has been actively researched for decades, yet only recently has mobile robotics begun to get traction in industrial applications. One of these industrial applications is the field of autonomous robotic navigation, which includes mapping, navigation, path planning, and obstacle avoidance.

In order for robotic navigation to work for developers of industrial solutions, SLAM technology that works for an entire structure (e.g., building) is required. SLAM is a technique used by a robot (or an autonomous vehicle) to build a map within an unknown environment, while at the same time keeping track of the robot's vehicle's current position.

Many SLAM systems used in academic research were developed for limited deployments, such as trials and experiments. These trials and experiments were typically conducted in limited areas of a building, such as a single room, a hallway, or a wing of the building. As such, these SLAM systems were never required to implement the accuracy and precision needed to cover large buildings and multiple-floor buildings, such as is typical of industrial buildings.

SUMMARY OF THE INVENTION

A method for mapping a multiple-floor structure includes building a plurality of maps that includes one map for each of at least two of the floors, detecting a set of anchor points, where the set of anchor points includes at least one anchor point on each of the maps, linking the anchor points to produce a set of linked anchor points, and aligning the maps around the set of linked anchor points to produce a set of aligned maps.

A method for mapping a structure using a single robot includes generating, by the robot, a first map at a first point in time, storing the first map, generating, by the same robot, a second map at a second point in time subsequent to the first point in time, and aggregating the first map and the second map to produce an aggregated map.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention relates to a method and apparatus for mapping of multiple-floor structures. Embodiments of the invention align maps of multiple floors in a common structure by selecting one or more anchor points and then linking these anchor points. By linking the anchor points, the same point in each floor is given the same (x, y) position in a coordinate plane. Embodiments of the invention work for structures having more than two floors, as well as for outdoor terrain mapping and mapping for multiple structures. Further embodiments of the invention employ a single robot that maps different parts of the structure at different times. Embodiments of the invention may be implemented in conjunction with a variety of SLAM techniques, including graph-based SLAM, particle-based SLAM, FastSLAM, and the like.

Figure 1:
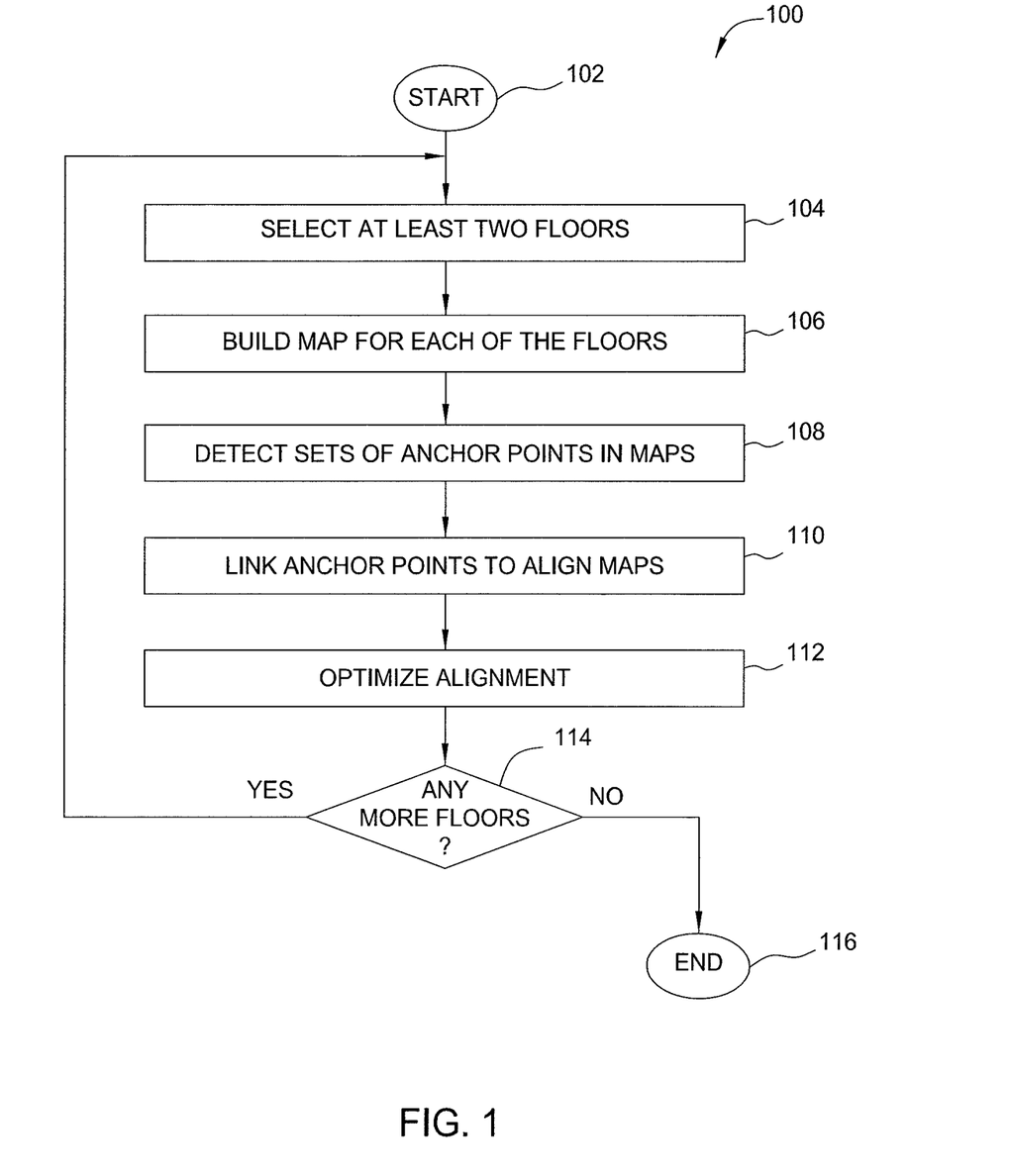
FIG. 1 is a flow diagram illustrating one embodiment of a method for mapping a multiple-floor structure.

FIG. 1 is a flow diagram illustrating one embodiment of a method 100 for mapping a multiple-floor structure, such as a building that is several stories tall. The method 100 may be implemented, for example by a SLAM system that uses a robot to map the structure.

The method 100 is initialized at step 102 and proceeds to step 104, where the method selects at least two floors of the multiple-floor structure. The method 100 then proceeds to step 106 and builds maps of selected floors. In one embodiment, a map for a given floor includes a plurality of nodes, where each node is associated with a position and a timestamp. The position and the timestamp define where the robot was on the given floor at the time indicated by the timestamp. Thus, the robot periodically adds nodes to the map as it moves through the given floor.

In step 108, the method 100 detects one or more sets of anchor points on the selected floors, in accordance with the maps for those floors. The anchor points are points that have the same (x, y) coordinates, but unique (z) coordinates, in a coordinate space. That is, in a set of anchor points, each of the points resides at the same (x, y) position on different floors. In one embodiment, the method 100 detects at least three sets of anchor points.

The set of anchor points can be manually detected (e.g., by a human user) or automatically selected (e.g., by the SLAM system). In one embodiment, a set of anchor points is manually or automatically detected by matching similar shapes (e.g., known structural features) on different floors. For example, an elevator shaft typically has the same shape and dimensions on each floor of a building. Thus, one or more corners of the elevator shaft could serve as an anchor point. In one embodiment, the method 100 detects similar shapes by locating right angles, which are typically well-defined. In a further embodiment, the method 100 detects similar shapes by extracting a shape and a limited radius around the shape from a given map, and then rotating the shape by several degrees to see what the shape might look like with different rotations. The method 100 then tries to match a shape from another map with one of the rotations.

In another embodiment, a location tracking device such as a global positioning system (GPS) is used to automatically detect the anchor points. In this case, the location tracking device associates geographical location information with each scanning or pose on the map.

In another embodiment, anchor points are automatically detected by placing physical anchor marks throughout the structure. These anchor marks can then be tracked by the robot (e.g., using laser, radio, or camera technology) during the mapping process. In this case, the anchor marks will be automatically associated with the corresponding poses during mapping.

In another embodiment, anchor points are detected post-mapping by re-recognizing the map. For example, the far north-east corner of the structure can be identified from the maps for each individual floor, hence identifying a set of anchor points.

Figure 2:
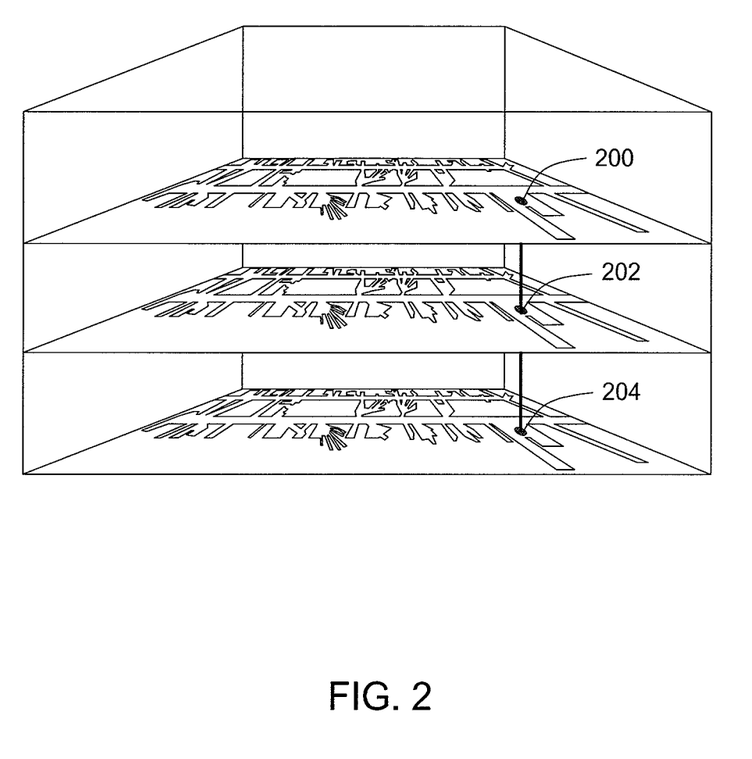
FIG. 2, for example, is a diagram illustrating a set of three anchor points that have been linked to each other.

In step 110, the method 100 links at least one set of anchor points in order to align the maps. That is, the method 100 selects the corresponding anchor points on each map and links the anchor points together. FIG. 2, for example, is a diagram illustrating a set of three anchor points 200, 202, and 204 that have been linked to each other. Each of the anchor points 200, 202, and 204 resides on a different floor, as illustrated.

In step 112, the method 100 optimizes the alignment of the maps. In one embodiment, this involves propagating an error correction with respect to the position of each node in each map along all nodes. One embodiment of a method for optimizing the alignment is discussed in greater detail with respect to FIG. 4.

In step 114, the method 100 determines whether any floors remain to be mapped. If the method 100 concludes in step 114 that there are more floors in the multiple-floor structure to be mapped, then the method 100 returns to step 104 and selects another floor, then proceeds as described above.

Alternatively, if the method 100 concludes in step 114 that there are no more floors in the multiple-floor structure to be mapped, then the method 100 terminates in step 116.

Figure 3:
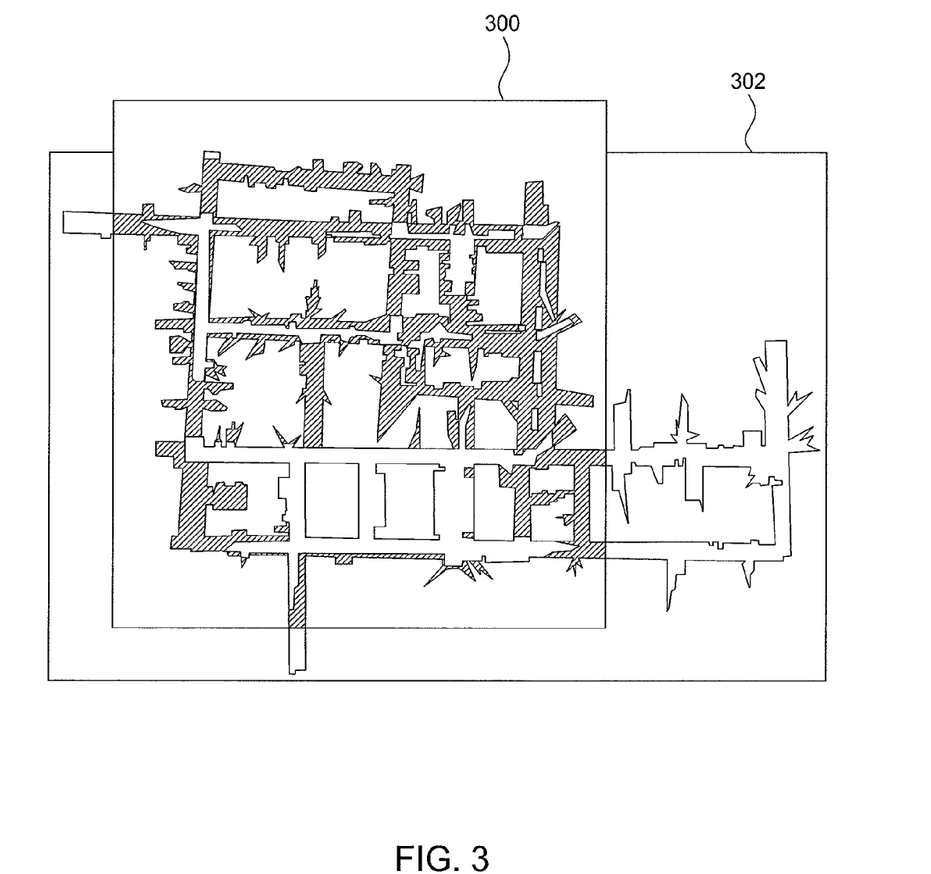
FIG. 3 is an exemplary set of maps illustrating the result of the method illustrated in FIG. 1.

FIG. 3 is an exemplary set of maps illustrating the result of the method 100. As illustrated, FIG. 3 includes two maps 300 and 302 corresponding to two different floors of a multiple-floor structure. The maps 300 and 302 have been aligned in accordance with the method 100. It can be seen that when the maps 300 and 302 are aligned, several features of the first map 300 line up with features of the second map 302.

A map of a multiple-floor structure, generated in accordance with the present invention, has many useful applications. For instance, rescue and emergency systems can use the map information to respond to emergencies in the multiple-floor structure. Moreover, if one is looking for a particular location or object within the multiple-floor structure, the location or object can be referenced in relation to one's current position (e.g., "it is in the same location, but one floor up").

As discussed above, alignment of the maps representing the individual floors may be optimized. In an exemplary two-dimensional scenario, a data structure used in building a map of a floor can be stored as:
1. Pose: ID (int), x, y, θ (double)
2. Link: From (ID int), To (ID int), diff (x, y, θ double), covar (3×3 matrix, double)

where IDs are unique to each pose and θ represents the orientation of the robot. Pose differences are represented and stored in the same structure as poses (i.e., (x, y, θ)). In a link, the pose difference is in the coordinate frame of the first scan (from ID). The covariance matrix is represented by:

$$\begin{pmatrix} xx & xy & x\theta \\ yx & yy & y\theta \\ \theta x & \theta y & \theta\theta \end{pmatrix}$$

The covariance matrix is symmetric, and the $x\theta$ and $y\theta$ values are ignored, so only three values are necessary: $xx$, $yy$, and $\theta\theta$.

Optional pre-processing may be applied to an input list of poses whose values are to be optimized. In one embodiment, the poses in the input list are stored in odometry order (i.e., ordered by their IDs). The poses comprise a closed set under links (i.e., every pose is connected to every other pose through some chain of links).

Figure 4:
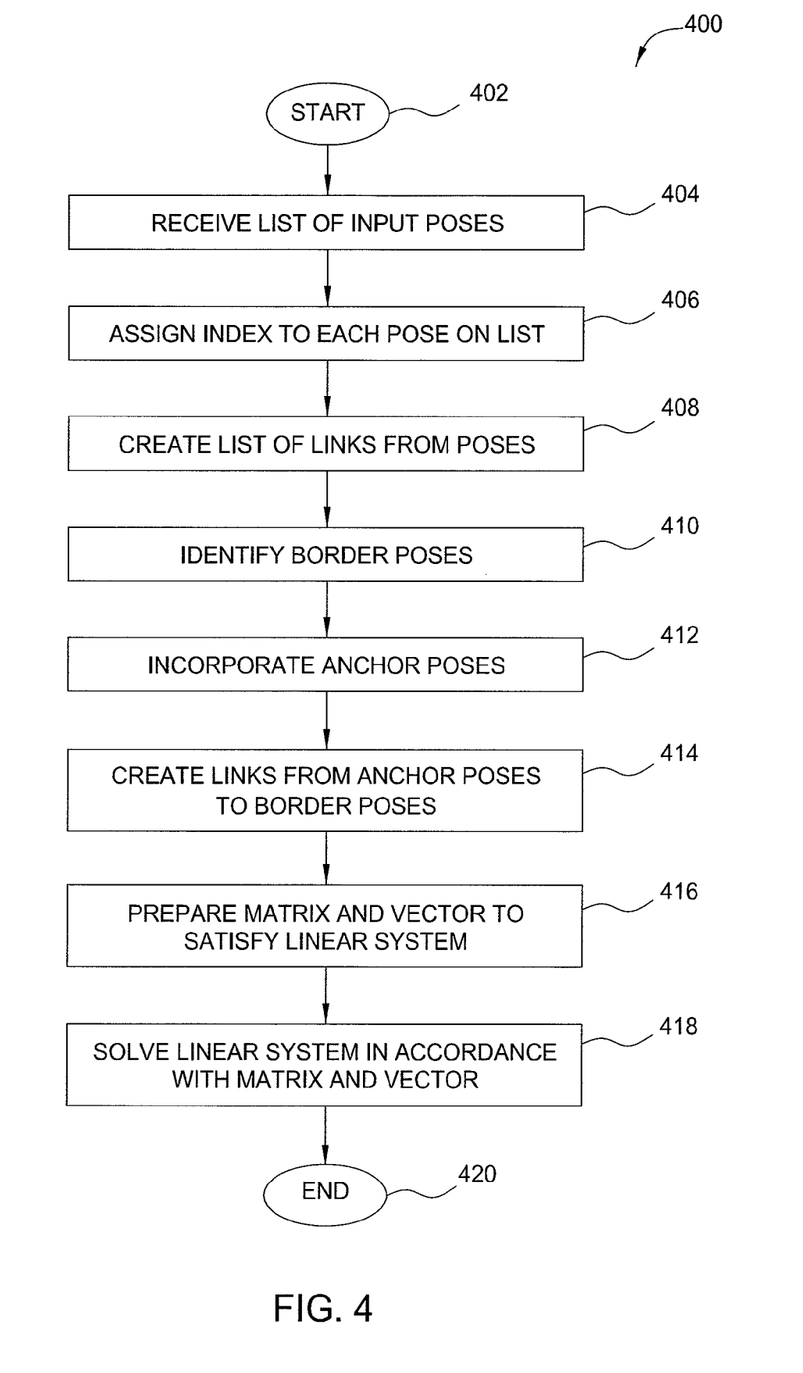
FIG. 4 is a flow diagram illustrating one embodiment of a method for optimizing an alignment of maps, according to the present invention.

FIG. 4 is a flow diagram illustrating one embodiment of a method 400 for optimizing an alignment of maps, according to the present invention. The method 400 may be implemented, for example by a SLAM system that uses a robot to map the structure.

The method 400 is initialized at step 402 and proceeds to step 404, where the method 400 receives the input list of poses. The method 400 then proceeds to step 406 and assigns an index to each pose. In one embodiment, the indices start from zero and are assigned to the poses according to their positions in the list. This index is used later to set up optimization matrices.

In step 408, the method 400 creates a list of all of the links that exist from the poses.

In step 410, the method 400 identifies a set of "border poses." In one embodiment, the border poses are identified by looking at the list of links and detecting any poses that are not on the input list of poses. Poses that are not on the input list of poses are added to a list of border poses. The border poses are then assigned indices starting from the next index after the last pose on the input list of poses. If no border poses are detected, then the list of border poses is empty.

In step 412, the method 400 incorporates at least one anchor pose (i.e., a pose associated with an anchor point). In one embodiment, an index of −1 is assigned to the graphical network in order to incorporate an anchor pose. The index of −1 will not appear in the optimization equation. The coordinates of the anchor pose are set equal to the coordinates of the first pose on the input list of poses.

In step 414, the method 400 creates a link from the anchor pose to each border pose (or to the first pose on the input list of poses). In one embodiment, these links have very small covariance (e.g., xx, yy=0.01; xy=0; θθ=0.0001).

In step 416 the method 400 prepares a G matrix and a b vector to satisfy the equation GX=b, which is a linear over-constrained system formed from the poses and links (where there are more links than poses). The linear system is solved with a preconditioned conjugate gradient, and then the results are used to define G and b again, and the process is repeated to convergence.

In one embodiment, the G matrix is prepared by first forming rotated covariance matrices and differences for each link in the list of links. The covariance matrix on each link is rotated to be in the global coordinate system (i.e., held in the coordinate system of the From pose of the link). The angle of the From pose of the link is defined as a, the covariance matrix is defined as C (with the $x\theta$ and $y\theta$ values zeroed), and the difference pose is defined as d. Thus, from the rotation matrix R is formed as:

$$\begin{pmatrix} \cos(a) & \sin(a) & 0 \\ -\sin(a) & \cos(a) & 0 \\ 0 & 0 & 1 \end{pmatrix}$$

One then forms:

$Cp=R*C*R'$ $dp=R*d$

These steps can be optimized since only the 2×2 part of C is rotated, and only the x, y part of d is rotated.

The G matrix is then formed as follows. For each link in the list of links, i, j is defined as the index of the From, To pose. The following is also defined: ii=i*3; jj=j*3. The following is then performed for diagonals:

$G(ii{:}ii+2,ii{:}ii+2)=G(ii{:}ii+2,ii{:}ii+2)+Cp$ $G(jj{:}jj+2,jj{:}jj+2)=G(jj{:}jj+2,jj{:}jj+2)+Cp$ while the following is performed for off-diagonals:

if (i!=j)[the normal case]

$G(ii{:}ii+2,jj{:}jj+2)=G(jj{:}jj+2,ii{:}ii+2)=G(ii{:}ii+2,jj{:}jj+2)-Cp$

If G is represented as a symmetric matrix, then there is no need to put in the lower off-diagonals. For i or j=−1, nothing is added in off the diagonal, but is added in the other index on the diagonal.

The b vector is formed as follows. For each link in the list of links, i, j is defined as the index of the From, To pose. The following is also defined: ii=i*3; jj=j*3. The following is then performed:

if (i!=j)[the normal case]

$b(ii{:}ii+2)=b(ii{:}ii+2)-Cp*dp$ $b(jj{:}jj+2)=b(jj{:}jj+2)+Cp*dp$

For i or j=−1, nothing is added in off the diagonal, but is added in the other index on the diagonal.

Having constructed the matrix G and vector b, the method 400 proceeds to step 418 and solves a linear system in accordance with G and b. In one embodiment, the linear system GX=b is solved with a preconditioned conjugate gradient, for example as discussed by Lu. Et al. in "Globally Consistent Range Scan Alignment for Environment Mapping," Autonomous Robots, 4, 333-349 (1997). In one embodiment, to achieve optimization for all poses (of multiple floors), the preconditioned conjugate gradient is run iteratively on GX=b. In this case, initial pose x, y, θ values obtained from scanning can be used as initial values of the X matrix. As a result of the preconditioned conjugate gradient calculation, values in the X matrix for the poses are updated. This preconditioned conjugate gradient calculation can be repeated iteratively until it converges. The most updated values in the X matrix will be the updated values of the (non-border) poses. The optimization then stops.

The method 400 terminates in step 420.

Once optimization is complete, all values for the poses on each individual floor will be updated, and the maps of all floors will be aligned according to the anchor points as discussed above. In many applications, the maps of different floors of the same structure may be off by an angle (i.e., rotation). Thus, in one embodiment, angles are normalized after the preconditioned conjugate gradient calculation. For example, values can be set between −π and π.

The examples discussed in connection with FIG. 4 are exemplary only. There are many alternate embodiments and variations that can be applied. For instance, alignment of maps is not limited to two dimensions (i.e., three degrees of freedom). Alignment according to the present invention can be extended to three dimensions (i.e., six degrees of freedom), while the selection of anchor points and optimization of poses work according to the same principles.

Mapping of an entire multiple-floor structure can be a time consuming and labor intensive process. For this reason, one may use multiple robots operating simultaneously, and then correlate the information from the multiple robots, in order to gather the greatest amount of information in the shortest amount of time. However, if multiple robots are not available, one can map the entire multiple-floor structure using a single robot. In this case, the single robot performs the mapping in multiple different mapping operations occurring at different times. For example, the single robot may map one floor, or one portion of one floor, per day for several days. The information from the multiple mapping operations can then be correlated as long as the same coordinate system is used for each mapping operation.

Figure 5:
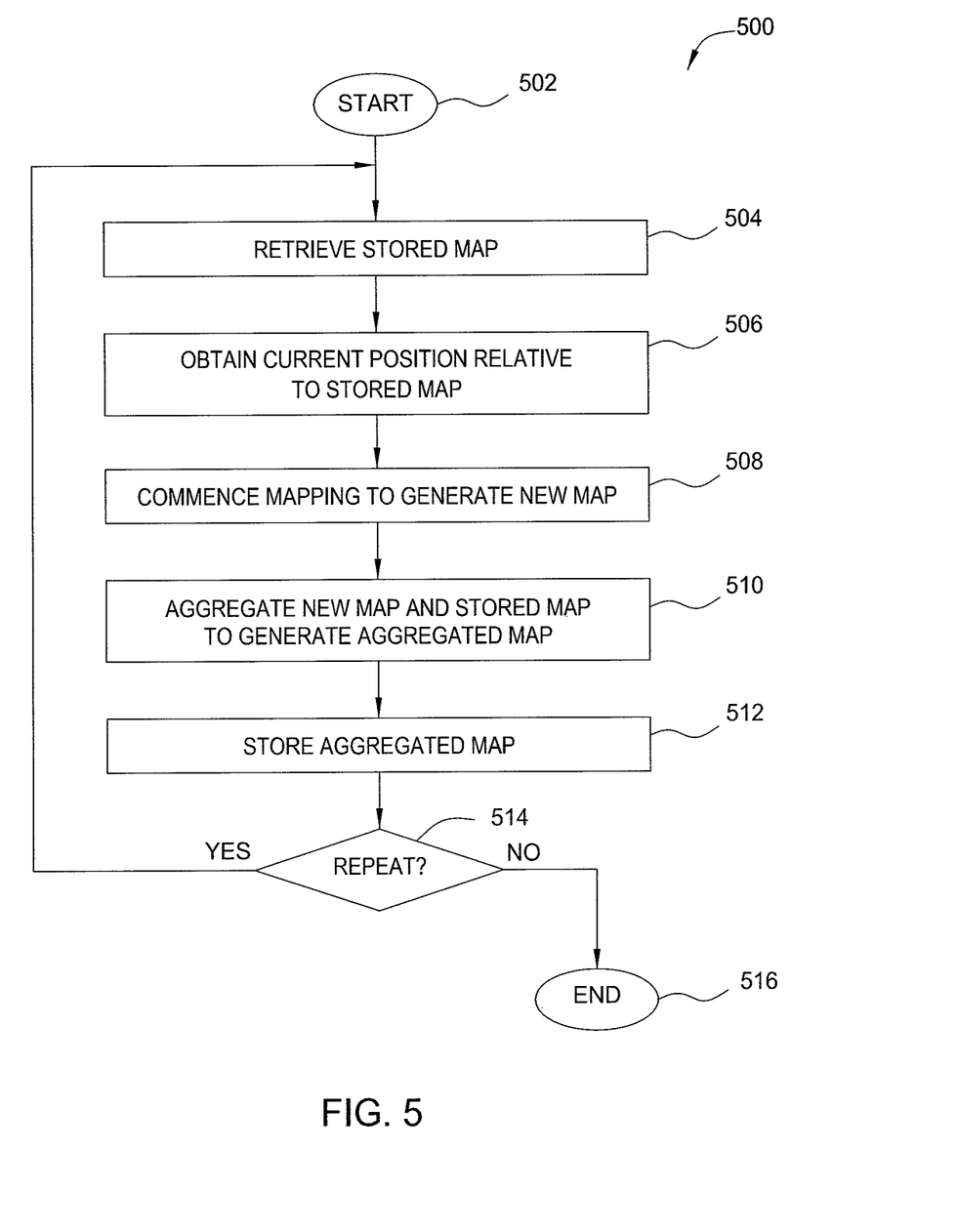
FIG. 5 is a flow diagram illustrating one embodiment of a method for mapping an area in multiple mapping operations using a single robot, according to the present invention.

FIG. 5, for example, is a flow diagram illustrating one embodiment of a method 500 for mapping an area in multiple mapping operations using a single robot, according to the present invention. The method 500 may be implemented, for example by a SLAM system that uses a robot to map the area.

The method 500 is initialized at step 502 and proceeds to step 504, where the method 500 retrieves a stored map for a previously partially explored portion of the area (e.g., as generated during a previous mapping operation).

In step 506, the method 500 obtains the robot's current position relative to the stored map. That is, the method 500 matches a currently viewed feature to a feature in the stored map in order to obtain a frame of reference into the stored map. This allows the robot to later correlate any new map data to the stored map.

In step 508, the method 500 maps the area to generate a new map, beginning from a position within the stored map.

In step 510, the method 500 aggregates the new map and the stored map to form an aggregated map. In one embodiment, the aggregating is performed simultaneously with the mapping of step 506.

In step 512, the method 500 stores the aggregated map. The method 500 then proceeds to step 514 and determines whether to repeat the mapping process (e.g., if there is additional space to map).

If the method 500 concludes in step 514 that the mapping process should be repeated, the method 500 returns to step 504 and proceeds as described above. Alternatively, if the method 500 concludes in step 514 that the mapping process should not be repeated, the method 500 terminates in step 516.

Thus, the method 500 treats mapping operations subsequent to an initial mapping operation as being performed by different robots, but it substantially ignores the time differences between mapping operations.

Thus, the robot may generate a first map at a first point in time that maps at least some of the structure. The same robot may then return to the structure at a second, subsequent point in time and generate a second map. The second map may map the same area as the first map, a different area than the first map, or may map some of the same area as the first map and some different area. The first map and the second map can then be aggregated in accordance with the method 500, for example to produce a complete mapping of a given area of the structure.

Mapping an area in multiple passes using a single robot can also convey other advantages. For example, the method 500 enables one to detect changes (e.g., opened/closed doors, addition/removal of walls, etc.) in a mapped environment by comparing a newly obtained map to a stored map. Such changes cannot be detected by multiple robots operating simultaneously, since they will see the same things.

Figure 6:
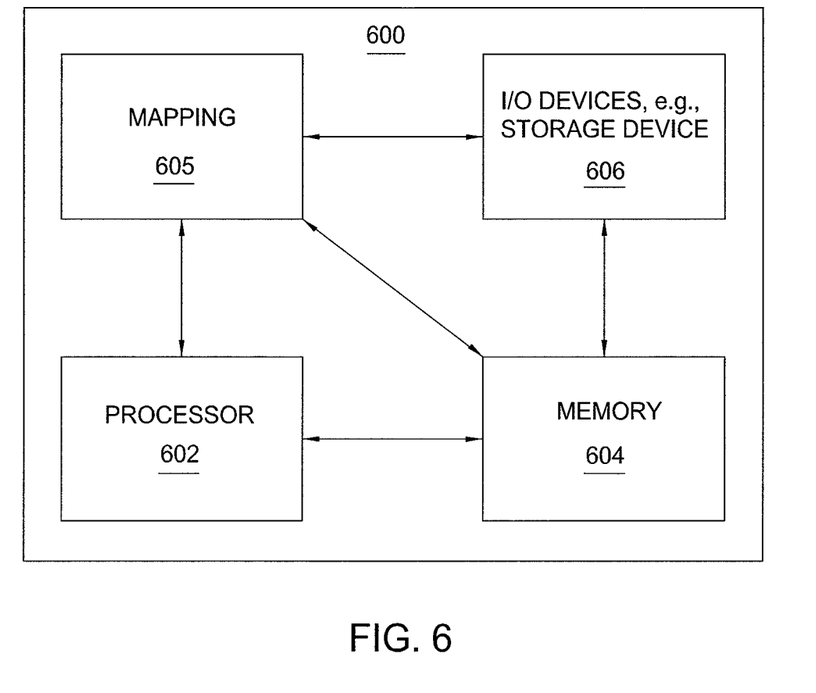
FIG. 6 is a high level block diagram of the present invention implemented using a general purpose computing device.

FIG. 6 is a high level block diagram of the present invention implemented using a general purpose computing device 600. It should be understood that embodiments of the invention can be implemented as a physical device or subsystem that is coupled to a processor through a communication channel. Therefore, in one embodiment, a general purpose computing device 600 comprises a processor 602, a memory 604, a mapping module 605, and various input/output (I/O) devices 606 such as a display, a keyboard, a mouse, a modem, a robot, a sensor, and the like. In one embodiment, at least one I/O device is a storage device (e.g., a disk drive, an optical disk drive, a floppy disk drive).

Alternatively, embodiments of the present invention (e.g., mapping module 605) can be represented by one or more software applications (or even a combination of software and hardware, e.g., using Application Specific Integrated Circuits (ASIC)), where the software is loaded from a storage medium (e.g., I/O devices 606) and operated by the processor 602 in the memory 604 of the general purpose computing device 600. Thus, in one embodiment, the mapping module 605 for mapping structures described herein with reference to the preceding Figures can be stored on a computer readable medium (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

Although various embodiments which incorporate the teachings of the present invention have been shown and described in detail herein, those skilled in the art can readily devise many other varied embodiments that still incorporate these teachings.

What is claimed is:

1. A method for mapping a structure comprising a plurality of floors, the method performed by a computing device, the method comprising:
   detecting at least one set of anchor points on a plurality of maps, wherein the plurality of maps have been generated via at least one robot, the plurality of maps includes one map for each of at least two of the plurality of floors, the at least one set of anchor points comprises at least one anchor point on each of the plurality of maps corresponding to the at least two of the plurality of floors, all anchor points in the at least one set of anchor points have the same (x,y) coordinates, and wherein the detecting comprises:
   extracting a first shape and a limited radius around the first shape from a map for a first floor of the at least two of the plurality of floors;
   rotating the first shape at a plurality of different rotations;
   matching the rotated first shape to a second shape from a map of a second floor of the at least two of the plurality of floors;
   including a point from the first shape and a corresponding point from the second shape in the at least one set of anchor points, when the first shape is matched to the second shape;
   linking the at least one set of anchor points; and
   aligning the plurality of maps corresponding to the at least two of the plurality of floors around the at least one set of linked anchor points to produce a set of aligned maps.

2. The method of claim 1, wherein each of the plurality of maps comprises, for a corresponding one of the at least two of the plurality of floors, a plurality of nodes, and each of the plurality of nodes is associated with a position on the corresponding one of the at least two of the plurality of floors and a timestamp indicating a time at which the position was recorded.

3. The method of claim 1, wherein each anchor point in the at least one set of anchor points has a unique (z) coordinate.

4. The method of claim 1, wherein the at least one set of anchor points comprises at least three sets of anchor points.

5. The method of claim 1, further comprising: optimizing the set of aligned maps.

6. The method of claim 1, wherein the at least one robot comprises two or more robots.

7. The method of claim 1, wherein the at least one robot comprises a single robot performing a plurality of mapping operations.

8. The method of claim 7, wherein the plurality of mapping operations comprises, for each of the plurality of maps:
   retrieving a stored map, the stored map mapping a portion of the structure that was previously explored by the single robot;
   obtaining a current position of the single robot relative to the stored map;
   commencing mapping from a first position indicated in the stored map, in order to generate a new map; and
   aggregating the stored map and the new map to produce an aggregated map.

9. The method of claim 1, wherein the first shape corresponds to a structural feature located in an interior of the first floor.

10. At least one non-transitory computer readable storage medium comprising instructions for mapping a structure comprising a plurality of floors, wherein the instructions cause a computing device to:
    detect at least one set of anchor points on a plurality of maps, wherein the plurality of maps have been generated by at least one robot, the plurality of maps includes one map for each of at least two of the plurality of floors, the at least one set of anchor points comprises at least one anchor point on each of the plurality of maps corresponding to the at least two of the plurality of floors, all anchor points in the at least one set of anchor points have the same (x,y) coordinates, and wherein to detect comprises to:
    extract a first shape and a limited radius around the first shape from a map for a first floor of the at least two of the plurality of floors;
    rotate the first shape at a plurality of different rotations;
    match the rotated first shape to a second shape from a map of a second floor of the at least two of the plurality of floors;

include a point from the first shape and a corresponding point from the second shape in the at least one set of anchor points, when the first shape is matched to the second shape;
link the at least one set of anchor points; and
align the plurality of maps corresponding to the at least two of the plurality of floors around the at least one set of linked anchor points to produce a set of aligned maps.

11. A system for mapping a structure comprising a plurality of floors, the system comprising a computing device configured to:
detect at least one set of anchor points on a plurality of maps, wherein the plurality of maps have been generated by at least one robot, the plurality of maps includes one map for each of at least two of the plurality of floors, the at least one set of anchor points comprises at least one anchor point on each of the plurality of maps corresponding to the at least two of the plurality of floors, all anchor points in the at least one set of anchor points have the same (x,y) coordinates, and wherein to detect comprises to:
extract a first shape and a limited radius around the first shape from a map for a first floor of the at least two of the plurality of floors;
rotate the first shape at a plurality of different rotations;
match the rotated first shape to a second shape from a map of a second floor of the at least two of the plurality of floors;
include a point from the first shape and a corresponding point from the second shape in the at least one set of anchor points, when the first shape is matched to the second shape;
link the at least one set of anchor points; and
align the plurality of maps corresponding to the at least two of the plurality of floors around the at least one set of linked anchor points to produce a set of aligned maps.

12. A method for mapping a structure using a robot, the method comprising:
generating, by the robot in a first mapping operation, a first map at a first point in time, the first map at least partially mapping the structure, wherein the structure comprises a plurality of floors;
storing the first map;
generating, by the robot in a second mapping operation separate from the first mapping operation, a second map at a second point in time subsequent to the first point in time, the second map at least partially mapping the structure, wherein the first map and the second map are included in a plurality of maps, the plurality of maps comprising one map for each of at least two of the plurality of floors;
aggregating the first map and the second map to produce an aggregated map;
detecting, in response to the aggregating, a change in the structure; and
detecting, in response to the change in the structure, at least one set of anchor points, wherein the at least one set of anchor points comprises at least one anchor point on each of the plurality of maps corresponding to the at least two of the plurality of floors, all anchor points in the at least one set of anchor points have the same (x,y) coordinates, and wherein the detecting the at least one set of anchor points comprises:
extracting a first shape and a limited radius around the first shape from a map for a first floor of the at least two of the plurality of floors;
rotating the first shape at a plurality of different rotations;
matching the rotated first shape to a second shape from a map of a second floor of the at least two of the plurality of floors;
including a point from the first shape and a corresponding point from the second shape in the at least one set of anchor points, when the first shape is matched to the second shape;
linking the at least one set of anchor points; and
aligning the plurality of maps corresponding to the at least two of the plurality of floors around the at least one set of linked anchor points to produce a set of aligned maps.

13. The method of claim 12, wherein each anchor point in the at least one set of anchor points has a unique (z) coordinate.

14. At least one non-transitory computer readable storage medium comprising instructions for mapping a structure using a robot, wherein the instructions are configured to:
generate, by the robot in a first mapping operation, a first map at a first point in time, the first map at least partially mapping the structure, wherein the structure comprises a plurality of floors;
store the first map;
generate, by the robot in a second mapping operation separate from the first mapping operation, a second map at a second point in time subsequent to the first point in time, the second map at least partially mapping the structure, wherein the first map and the second map are included in a plurality of maps, the plurality of maps including one map for each of at least two of the plurality of floors;
aggregate the first map and the second map to produce an aggregated map;
detect, in response to the aggregating, a change in the structure;
detect, in response to the change in the structure, at least one set of anchor points on the plurality of maps, wherein the at least one set of anchor points comprises at least one anchor point on each of the plurality of maps corresponding to the at least two of the plurality of floors, all anchor points in the at least one set of anchor points have the same (x,y) coordinates, and wherein to detect the at least one set of anchor points is to cause a computing device to:
extract a first shape and a limited radius around the first shape from a map for a first floor of the at least two of the plurality of floors;
rotate the first shape at a plurality of different rotations;
match the rotated first shape to a second shape from a map of a second floor of the at least two of the plurality of floors;
include a point from the first shape and a corresponding point from the second shape in the at least one set of anchor points, when the first shape is matched to the second shape;
link the at least one set of anchor points; and
align the plurality of maps corresponding to the at least two of the plurality of floors around the at least one set of linked anchor points to produce a set of aligned maps.

15. A system for mapping a structure using a robot, the system configured to:
generate, by the robot in a first mapping operation, a first map at a first point in time, the first map at least partially mapping the structure, wherein the structure comprises a plurality of floors;
store the first map;
generate, by the robot in a second mapping operation separate from the first mapping operation, a second map at a second point in time subsequent to the first point in time, the second map at least partially mapping the structure, wherein the first map and the second map are included in a plurality of maps, the plurality of maps including one map for each of at least two of the plurality of floors;

aggregate the first map and the second map to produce an aggregated map;

detect, in response to the aggregating, a change in the structure; and detect, in response to the change in the structure, at least one set of anchor points on the plurality of maps, wherein the at least one set of anchor points comprises at least one anchor point on each of the plurality of maps corresponding to the at least two of the plurality of floors, all anchor points in the at least one set of anchor points have the same (x,y) coordinates, and wherein to detect the at least one set of anchor points is to cause a computing device to:

extract a first shape and a limited radius around the first shape from a map for a first floor of the at least two of the plurality of floors;

rotate the first shape at a plurality of different rotations;

match the rotated first shape to a second shape from a map of a second floor of the at least two of the plurality of floors;

include a point from the first shape and a corresponding point from the second shape in the at least one set of anchor points, when the first shape is matched to the second shape;

link the at least one set of anchor points; and align the plurality of maps corresponding to the at least two of the plurality of floors around the at least one set of linked anchor points to produce a set of aligned maps.

16. The system of claim 15, wherein the system is configured to:

retrieve the first map;

obtain a current position of the robot relative to the first map; and commence mapping from a first position indicated in the first map, in order to generate a second map, wherein the first position is different from the current position.

17. The system of claim 15, wherein the system is configured to:

retrieve a first map;

obtain a current position of the robot relative to the first map; and commence mapping from a first position indicated in the first map, in order to generate a second map, wherein the first position is the current position.

* * * * *